United States Patent
Huang et al.

(10) Patent No.: US 12,283,319 B2
(45) Date of Patent: Apr. 22, 2025

(54) OPERATING CIRCUIT AND OPERATING METHOD OF RESISTIVE RANDOM ACCESS MEMORY

(71) Applicant: Peking University, Beijing (CN)

(72) Inventors: Peng Huang, Beijing (CN); Yizhou Zhang, Beijing (CN); Yulin Feng, Beijing (CN); Jinfeng Kang, Beijing (CN); Xiaoyan Liu, Beijing (CN); Lifeng Liu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 161 days.

(21) Appl. No.: 17/631,611

(22) PCT Filed: Aug. 2, 2019

(86) PCT No.: PCT/CN2019/099061
§ 371 (c)(1),
(2) Date: Jan. 31, 2022

(87) PCT Pub. No.: WO2021/022410
PCT Pub. Date: Feb. 11, 2021

(65) Prior Publication Data
US 2022/0277791 A1    Sep. 1, 2022

(51) Int. Cl.
G11C 11/00    (2006.01)
G11C 13/00    (2006.01)

(52) U.S. Cl.
CPC .................. G11C 13/0069 (2013.01)

(58) Field of Classification Search
CPC ........ G11C 13/0069; G11C 2013/0092; G11C 2213/77; G11C 2213/79; G11C 13/0028; G11C 2013/0083
(Continued)

(56) References Cited

U.S. PATENT DOCUMENTS 7,529,116 B2 *  5/2009  Jung ..................... G11C 11/24
                                                       365/100
8,098,518 B2 *  1/2012  Kim ....................... G11C 8/10
                                                       365/163
(Continued)

FOREIGN PATENT DOCUMENTS

CN    101393768 A    3/2009
CN    106128496 A    11/2016
(Continued)

OTHER PUBLICATIONS

PCT International Search Report for PCT Application No. PCT/CN2019/099061 mailed Apr. 29, 2020 (6 pages, with English translation).
(Continued)

*Primary Examiner* — Tha-O H Bui
(74) *Attorney, Agent, or Firm* — Scully, Scott, Murphy & Presser, P.C.

(57) ABSTRACT

An operating circuit and an operating method of a resistive random-access memory are provided, the operating circuit includes: at least one capacitance connected in series with the resistive random-access memory, so that the resistive random-access memory is grounded through the at least one capacitance. The operating method includes: connecting at least one capacitance in series with a resistive random-access memory, so that the resistive random-access memory is grounded through the capacitance; applying a forming pulse voltage or a set pulse voltage on the resistive random-access memory to achieve a forming operation or a set operation of the resistive random-access memory.

4 Claims, 2 Drawing Sheets

(58) Field of Classification Search
USPC .......................................................... 365/148
See application file for complete search history.

(56) References Cited

U.S. PATENT DOCUMENTS

| | | | | |
|---|---|---|---|---|
| 8,331,137 | B2* | 12/2012 | Takashima | G11C 13/0097 |
| | | | | 365/163 |
| 8,355,275 | B2* | 1/2013 | Ichihara | G11C 13/0007 |
| | | | | 365/189.16 |
| 8,498,142 | B2* | 7/2013 | Murooka | G11C 13/0007 |
| | | | | 365/163 |
| 9,601,546 | B1 | 3/2017 | Ando et al. | |
| 11,024,376 | B2* | 6/2021 | Mori | G11C 13/004 |
| 2004/0051094 | A1* | 3/2004 | Ooishi | H10B 63/00 |
| | | | | 257/4 |
| 2010/0321977 | A1* | 12/2010 | Sekar | G11C 13/0069 |
| | | | | 365/230.06 |
| 2012/0300530 | A1* | 11/2012 | Meade | G11C 13/0061 |
| | | | | 365/148 |
| 2013/0223126 | A1* | 8/2013 | Kwak | G11C 13/0004 |
| | | | | 365/148 |
| 2014/0217348 | A1 | 8/2014 | Pham et al. | |

FOREIGN PATENT DOCUMENTS

| | | |
|---|---|---|
| CN | 107045883 A | 8/2017 |
| CN | 109863489 A | 6/2019 |

OTHER PUBLICATIONS

PCT Written Opinion for PCT Application No. CT/CN2019/099061 mailed Apr. 29, 2020 (3 pages).

\* cited by examiner

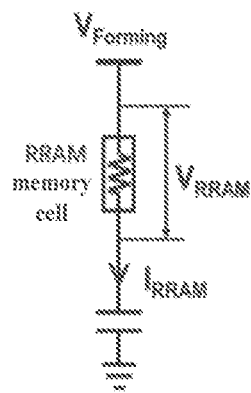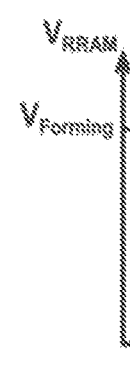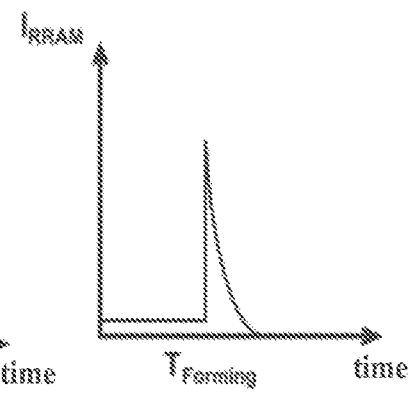
FIG. 1a          FIG. 1b          FIG. 1c
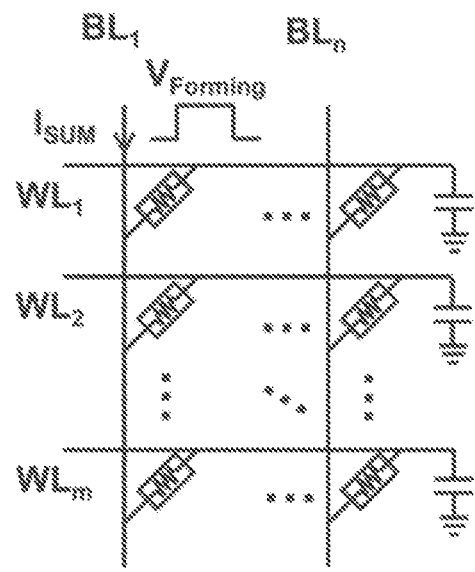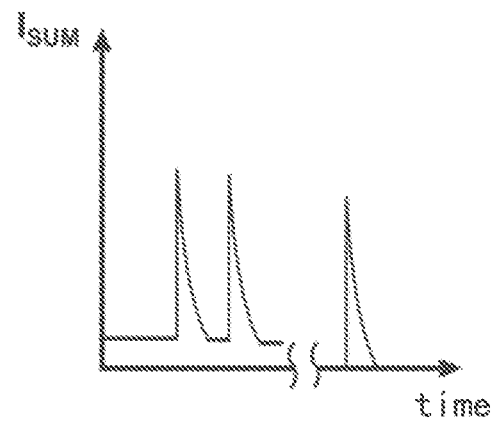
FIG. 2a          FIG. 2b

OPERATING CIRCUIT AND OPERATING METHOD OF RESISTIVE RANDOM ACCESS MEMORY

CROSS-REFERENCE TO RELATED APPLICATION

This application is a National Stage Application of International Application No. PCT/CN2019/099061, filed on Aug. 2, 2019, entitled "OPERATING CIRCUIT AND OPERATING METHOD OF RESISTIVE RANDOM-ACCESS MEMORY", all of the contents of which are incorporated hereby reference in its entirety.

TECHNICAL FIELD

The present disclosure relates to a field of semiconductor device and integrated circuit technology, relates to an operating circuit and an operating method of a resistive random-access memory, and in particular, to an operating circuit and an operating method achieving fast and low-power consumption forming and set of a resistive random-access memory by using capacitance.

BACKGROUND

Resistive random-access memory (RRAM) can be used as a new device for storage and neural network acceleration functions in the future due to its good performance, such as quick and low-power consumption programming process, good durability and reliable dimension shrinking ability. However, after the resistive random-access memory is manufactured and before it is normally used, a forming process is generally needed for the resistive random-access memory, which switches the resistive random-access memory from the initial high resistance to the low resistance by applying a voltage to the resistive random-access memory. After the resistive random-access memory is formed, the resistive random-access memory can perform set or reset operations normally. The forming process consumes a lot of time and energy, and as the size of the resistive random-access memory array expands, the power consumption and time issues in the forming process may become more significant. Meanwhile, the forming process may greatly influence the performance of the resistive random-access memory in the subsequent normal operations. Therefore, a forming method that can quickly complete the forming of the resistive random-access memory with low power consumption in batches and optimize the performance of subsequent resistive random-access memory is of great significance.

In addition, similar with the forming process, the set process of resistive random-access memory also consumes a lot of time and energy.

SUMMARY

In view of this, the main purpose of the present disclosure is to provide an operating circuit and an operating method of a resistive random-access memory, so as to achieve the quick and low-power consumption forming and set of the resistive random-access memory.

In order to achieve the above purpose, an operating circuit of a resistive random-access memory is provided, including: at least one capacitance connected in series with the resistive random-access memory, so that the resistive random-access memory is grounded through the at least one capacitance.

In the embodiments of the present disclosure, the resistive random-access memory includes a resistive random-access memory cell, and the capacitance is connected in series with a bottom electrode terminal of the resistive random-access memory cell. The memory cell includes a 1R structure having one resistive random-access memory cell, or a 1T1R structure having one transistor and one resistive random-access memory cell, or a 1S1R structure having one selector and one resistive random-access memory cell.

In the embodiments of the present disclosure, the resistive random-access memory includes an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction, and each word line is connected in series with one capacitance and is grounded through the capacitance.

In the embodiments of the present disclosure, the resistive random-access memory includes an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction, line resistances of the word line between any two adjacent resistive random-access memory cells are $R_{wire}$ and line capacitances of the word line between any two adjacent resistive random-access memory cells are $C_{wire}$. Each of the line capacitances is connected in parallel, and an influence of the line capacitances is considered to be grounded through one capacitance of $n \times C_{wire}$ on the word line.

In order to achieve the above purpose, an operating method of a resistive memory is further provided, including: connecting at least one capacitance in series with a resistive random-access memory, so that the resistive random-access memory is grounded through the at least one capacitance; applying a forming pulse voltage or a set pulse voltage on the resistive random-access memory to achieve a forming operation or a set operation of the resistive random-access memory.

In the embodiments of the present disclosure, the resistive random-access memory includes a resistive random-access memory cell, the capacitance is connected in series with a bottom electrode terminal of the resistive random-access memory cell, and the forming pulse voltage or the set pulse voltage is applied to the top electrode terminal of the resistive random-access memory. The memory cell comprises a 1R structure having one resistive random-access memory cell, or a 1T1R structure having one transistor and one resistive random-access memory cell, or a 1S1R structure having one selector and one resistive random-access memory cell.

In the embodiments of the present disclosure, the resistive random-access memory comprises an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction, wherein the connecting at least one capacitance in series with a resistive random-access memory comprises connecting one capacitance on each word line, so that bottom electrode terminals of a plurality of resistive random-access memory cells connected to the same word line are grounded through the one capacitance; wherein the forming pulse voltages or the set pulse voltages are applied to the bit lines connected to the top electrode terminals of the plurality of resistive random-access memory cells.

In the embodiments of the present disclosure, the resistive random-access memory comprises an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction, line resistances of the word line between any two adjacent resistive random-access memory cells are $R_{wire}$ and line capacitances of the word line between any two adjacent resistive random-access memory cells are $C_{wire}$, each of the line capacitances is connected in parallel, and an influence of the line capacitances is considered to be grounded through one capacitance of $n \times C_{wire}$ on the word line; wherein the connecting at least one capacitance in series with a resistive random-access memory comprises using the line capacitances connected in parallel as grounded capacitances; wherein the forming pulse voltages or the set pulse voltages are applied to the bit lines connected to the top electrode terminals of the plurality of resistive random-access memory cells.

In the embodiments of the present disclosure, the forming pulse voltages are applied to the bit lines connected to the top electrode terminals of the plurality of resistive random-access memory cells specifically includes: selecting a first row bit line $BL_1$ through a bit line terminal MUX, floating a word line terminal MUX, so that the word lines $WL_1$, $WL_2$, . . . , $WL_m$ for each column are grounded through the capacitances; applying a forming pulse voltage with a certain duration to the first row bit line $BL_1$, so as to complete a forming process of m resistive random-access memory cells connected to the first row bit line $BL_1$; turning on and grounding the word line terminal MUX, and resetting voltages on the capacitances to 0 after the forming process of the m resistive random-access memory cells connected to the first row bit line $BL_1$ are completed; after that, turning off the word line terminal MUX, and selecting a second row bit line $BL_2$ through the bit line terminal MUX, applying a forming pulse voltage with a certain duration to the second row bit line $BL_2$, so as to complete a forming process of m resistive random-access memory cells connected to the second row bit line $BL_2$; repeating the above process until a forming process of m resistive random-access memory cells connected to a $n_{th}$ row bit line $BL_n$ is completed, so that a forming process of the entire resistive random-access memory array is completed.

In the embodiments of the present disclosure, the set pulse voltages are applied to the bit lines connected to the top electrode terminals of the plurality of resistive random-access memory cells specifically includes: selecting a first row bit line $BL_1$ through a bit line terminal MUX, floating a word line terminal MUX, so that the word lines $WL_1$, $WL_2$, . . . , $WL_m$ for each column are grounded through the capacitances; applying a set pulse voltage with a certain duration to the first row bit line $BL_1$, so as to complete a set process of m resistive random-access memory cells connected to the first row bit line $BL_1$; turning on and grounding the word line terminal MUX, and resetting voltages on the capacitances to 0 after the set process of the m resistive random-access memory cells connected to the first row bit line $BL_1$ are completed; after that, turning off the word line terminal MUX, and selecting a second row bit line $BL_2$ through the bit line terminal MUX, applying a set pulse voltage with a certain duration to the second row bit line $BL_2$, so as to complete a set process of m resistive random-access memory cells connected to the second row bit line $BL_2$; repeating the above process until a set process of m resistive random-access memory cells connected to a $n_{th}$ row bit line $BL_n$ is completed, so that a set process of the entire resistive random-access memory array is completed.

BRIEF DESCRIPTION OF THE DRAWINGS

In order to further describe the content of the present disclosure, the present disclosure will be described in detail below with reference to the drawings, wherein:

FIG. 1a is a schematic diagram of a connection between a capacitance and a resistive random-access memory cell when a resistive random-access memory comprises the resistive random-access memory cell according to the embodiments of the present disclosure;

FIG. 1b is a schematic diagram of a voltage change at two terminals of a resistive random-access memory cell in a forming process when a resistive random-access memory comprises the resistive random-access memory cell according to the embodiments of the present disclosure;

FIG. 1c is a schematic diagram of a current change in a circuit in a forming process when a resistive random-access memory comprises a resistive random-access memory cell according to the embodiments of the present disclosure;

FIG. 2a is a schematic diagram of a connection between a capacitance and a resistive random-access memory array when a resistive random-access memory comprises an m×n resistive random-access memory array structure according to the embodiments of the present disclosure;

FIG. 2b is a schematic diagram of a total current change in a circuit when a resistive random-access memory comprises an m×n resistive random-access memory array structure and forming the resistive random-access memory cells in the same BL according to the embodiments of the present disclosure;

DETAILED DESCRIPTION OF EMBODIMENTS

Figure 3:
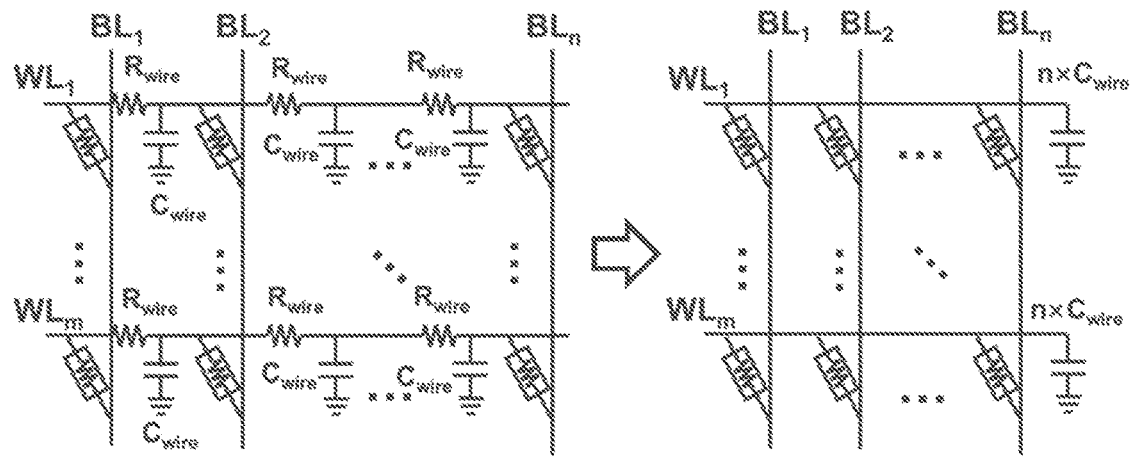
FIG. 3 is a schematic diagram in which a parasitic effect in a resistive random-access memory array is equalized to be grounded through a capacitance when a resistive random-access memory comprises a large-size resistive random-access memory array structure according to the embodiments of the present disclosure.

In order to make the technical solutions and advantages of the present disclosure more apparent, the present disclosure will be further described in detail below in combination with specific embodiments and with reference to the drawings.

The present disclosure provides an operating circuit and an operating method of a resistive random-access memory, the operating circuit includes at least one capacitance connected in series with a resistive random-access memory, so that the resistive random-access memory is grounded through the capacitance. The operation method is to connect the at least one capacitance in series with the resistive random-access memory, so that the resistive random-access memory is grounded through the capacitance; apply a forming or set pulse voltage to the resistive random-access memory to achieve the forming or set operation of the resistive random-access memory.

After the forming or set pulse voltage is applied, before the forming or set is completed, a resistance of the resistive random-access memory is high, a charging speed of the capacitance is slow, the applied forming or set pulse voltage is mainly applied to the resistive random-access memory, so this voltage may support to complete the forming or set of the resistive random-access memory. After the forming or set is completed, the resistance of the resistive random-access memory is reduced, the charging speed of the capacitance is accelerated, and the voltage on the resistive random-access memory is quickly reduced, thereby reducing a current flowing through the resistive random-access memory until it is reduced to near zero.

Based on the foregoing method of using the capacitance to complete the forming or set, the present disclosure also provides forming or set operations that may complete the resistive random-access memory array in parallel and with low power consumption. Since in this operation method, a duration of a larger current generated during a device forming process is shorter, and the moments when the forming of each resistive random-access memory device occurs are also different, so even if the forming of a large number of devices is completed in parallel, the total current in the circuit may still be withstood. Therefore, this method may complete the forming of the resistive random-access memory in batches with low-power consumption and high-efficiency, and significantly reduce the forming time of the resistive random-access memory array and the power consumption. Meanwhile, since the duration for the device flowing through a larger current is shorter, the resistance state reached after the forming is higher, and a low resistance during the subsequent set and reset operation processes is also higher, resulting in a decrease in the subsequent operation current, so that the power consumption of subsequent operations may be reduced.

FIG. 1a is a schematic diagram of a connection between a capacitance and a resistive random-access memory cell when a resistive random-access memory comprises the resistive random-access memory cell according to the embodiments of the present disclosure. In this embodiment, the resistive random-access memory comprises the resistive random-access memory cell, the capacitance is connected in series to a bottom electrode terminal of the resistive random-access memory cell, and the forming or set pulse voltage is applied to a top electrode terminal of the resistive random-access memory cell. The memory cell comprises a 1R structure having one resistive random-access memory cell, or a 1T1R structure having one transistor and one resistive random-access memory cell, or a 1S1R structure having one selector and one resistive random-access memory cell.

In this embodiment, the resistive random-access memory device is connected in series with one capacitance, and is grounded through the capacitance. A voltage signal during the forming is applied to the top electrode terminal of the resistive random-access memory. Before the forming pulse voltage is applied, there is no charge accumulation on the capacitance, and a voltage across the capacitance is 0. After the forming pulse voltage is applied and before the resistive random-access memory is formed, since a resistance of the resistive random-access memory is extremely large, a current flowing through the resistive random-access memory is very small, so a charging speed of the capacitance is very slow, and a voltage on the capacitance rises very slowly. The voltage is mainly applied to the resistive random-access memory, so the voltage may support the resistive random-access memory to finish the forming process. After the resistive random-access memory is formed, since the resistance is reduced, the current flowing through the resistive random-access memory increases and the charging speed of the capacitance increases. Therefore, the voltage on the capacitance rises rapidly, resulting in a rapid decay of the current in the circuit, which finally decreases to zero. Therefore, in the forming process of a single device, a current distribution is concentrated in a short time period after the forming is completed. This peak-shaped current may greatly reduce energy consumption compared with traditional forming methods.

FIG. 1b is a schematic diagram of a voltage change at two terminals of a resistive random-access memory cell in a forming process when a resistive random-access memory comprises the resistive random-access memory cell according to the embodiments of the present disclosure. FIG. 1c is a schematic diagram of a current change in a circuit in a forming process when a resistive random-access memory comprises a resistive random-access memory cell according to the embodiments of the present disclosure.

The same principle may also be applied for the set process of the resistive random-access memory, just by changing the forming pulse voltage to the set pulse voltage, a fast and low-power consumption set process may be achieved in batches. In the present disclosure, the forming process is taken as an example, but it is also applicable to the set process.

In another embodiment, as shown in FIG. 2a, FIG. 2a is a schematic diagram of a connection between a capacitance and a resistive random-access memory array when a resistive random-access memory comprises an m×n resistive random-access memory array structure according to the embodiments of the present disclosure. The resistive random-access memory comprises an m×n resistive random-access memory array structure. Each of m and n is a natural numbers greater than or equal to 1. Top electrode terminals of a plurality of resistive random-access memory cells are connected to the same bit line in a column direction, and bottom electrode terminals of the plurality of resistive random-access memory cells are connected to the same word line in a row direction, and each word line is connected in series with one capacitance and is grounded through the capacitance. In this embodiment, the at least one capacitance connected in series with the resistive random-access memory means that one capacitance is connected in series on each word line, so that the bottom electrode terminals of the plurality of resistive random-access memory cells connected to the same word line are grounded through the capacitance; the forming or set pulse voltages are applied to the bit lines connected to the top electrode terminals of the plurality of resistive random-access memory cells.

In FIG. 2a, each resistive random-access memory in a row is grounded through one capacitance connected in series. The forming pulse voltages are applied to the top electrode terminals of resistive random-access memory in this row, and the forming of devices in this row can be finished at the same time. Since the current during the forming of a single device is a spike type with a very short time, and the moments when the forming of different devices occurs are different, a burden of a maximum value of a total current during the entire forming process on the circuit is greatly reduced. Therefore, a large number of devices in the entire row may be formed at the same time, and the total current does not exceed a limit of the maximum current that the circuit may withstand. FIG. 2b shows a schematic diagram of a total current change in a circuit when a resistive random-access memory comprises an m×n resistive random-access memory array structure according to the embodiments of the present disclosure.

FIG. 3 is a schematic diagram in which a parasitic effect in a resistive random-access memory array is equalized to be grounded through a capacitance when a resistive random-access memory comprises a large-size resistive random-access memory array structure according to the embodiments of the present disclosure. As shown in FIG. 3, in this embodiment, a line capacitance of the resistive random-access memory array itself is used as a capacitance connected in series. The resistive random-access memory includes an m×n resistive random-access memory array structure. Each of m and n is a natural number greater than or equal to 1. The top electrode terminals of a plurality of resistive random-access memory cells are connected to the same bit line in the column direction, and the bottom electrode terminals of the plurality of resistive random-access memory cells are connected to the same word line in the row direction. In this embodiment, the line resistances of the word line between any two adjacent resistive random-access memory cells are $R_{wire}$, and the line capacitances of the word line between any two adjacent resistive random-access memory cells are $C_{wire}$. When the line resistance $R_{wire}$ in the array is much smaller than the resistance of the resistive random-access memory, the line resistance may be approximately ignored, so the parasitic effect of the wire may be simplified to be influenced by only the line capacitances. Each of the line capacitances is connected in parallel, and an influence of the line capacitances may be considered to be grounded through one capacitance of $n \times C_{wire}$ on the word line. This type of the capacitance may play a same role as the capacitance in FIG. 1. Therefore, when the resistive random-access memory array reaches a certain size, for example, in a 22 nm process, when $n \geq 512$, the parasitic capacitance is large enough to support the resistive random-access memory to complete the parallel forming. At this time, the parasitic capacitance effect of the wire may be used to complete the forming process without the need for the circuit to prepare additional capacitances. In this embodiment, the at least one capacitance connected in series with the resistive random-access memory means that the line capacitances connected in parallel are used as grounded capacitances; the forming or set pulse voltages are applied to the bit lines connected to the top electrode terminals of the plurality of resistive random-access memory cells.

Figure 4A:
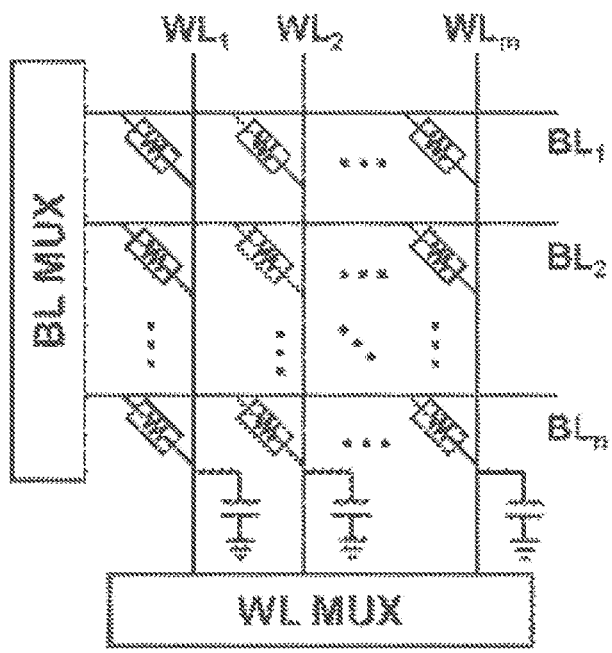
FIG. 4a is a schematic diagram of a circuit structure for forming or set a resistive random-access memory array in batches according to the embodiments of the present disclosure.
Figure 4B:
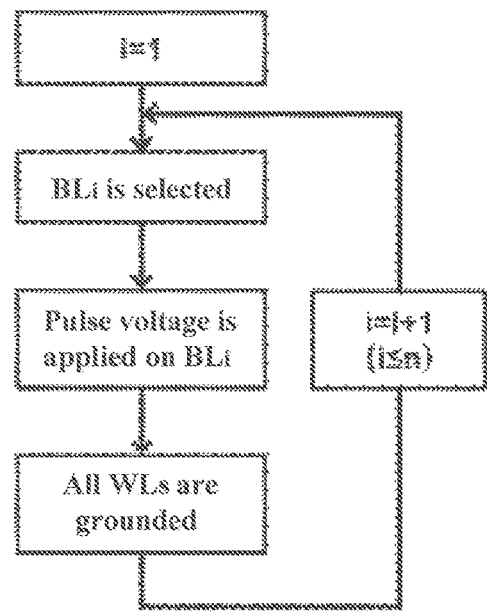
FIG. 4b is a flowchart of a method for forming or set a resistive random-access memory array in batches according to the embodiments of the present disclosure.

FIG. 4a is a schematic diagram of a circuit structure for forming or set a resistive random-access memory array in batches according to the embodiments of the present disclosure, and FIG. 4b is a flowchart of a method for forming or set a resistive random-access memory array in batches according to the embodiments of the present disclosure.

Referring to FIGS. 4a and 4b, the forming process of the resistive random-access memory array in batches specifically includes: a first row bit line $BL_1$ is selected through a bit line terminal MUX, and a word line terminal MUX is left floating, so that word lines $WL_1$, $WL_2$ . . . , $WL_m$ for each column are grounded through the capacitances. A forming pulse voltage with a certain duration is applied to the first row bit line $BL_1$, so as to complete the forming process of m resistive random-access memory cells connected to the first row bit line $BL_1$; after the forming process of the m resistive random-access memory cells connected to the first row bit line $BL_1$ is completed, the word line terminal MUX is turned on and grounded, and the voltages on the capacitances are reset to 0; after that, the word line terminal MUX is turned off, and a second row bit line $BL_2$ is selected through the bit line terminal MUX. A forming pulse voltage with a certain duration is applied to the second row bit line $BL_2$, so as to complete the forming process of n resistive random-access memory cells connected to the second row bit line $BL_2$; repeat the above process until the forming process of m resistive random-access memory cells connected to the $n_{th}$ row bit line $BL_n$ is completed, so that the forming process of the entire resistive random-access memory array is completed.

Referring to FIGS. 4a and 4b, the set process of the resistive random-access memory array in batches specifically includes: a first row bit line $BL_1$ is selected through a bit line terminal MUX, and a word line terminal MUX is left floating, so that word lines $WL_1$, $WL_2$, . . . , $WL_m$ for each column are grounded through the capacitances. A set pulse voltage with a certain duration is applied to the first row bit line $BL_1$, so as to complete the set process of m resistive random-access memory cells connected to the first row bit line $BL_1$; after the set process of the m resistive random-access memory cells connected to the first row bit line $BL_1$ is completed, the word line terminal MUX is turned on and grounded, and the voltages on the capacitances are reset to 0; after that, the word line terminal MUX is turned off, and a second row bit line $BL_2$ is selected through the bit line terminal MUX. A set pulse voltage with a certain duration is applied to the second row bit line $BL_2$, so as to complete the set process of m resistive random-access memory cells connected to the second row bit line $BL_2$; repeat the above process until the set process of m resistive random-access memory cells connected to the $n_{th}$ row bit line $BL_n$ is completed, so that the set process of the entire resistive random-access memory array is completed.

It should be noted that the above embodiments mainly use the forming process of the resistive random-access memory as the example. In practical applications, the same principle may also be used for the set process of the resistive random-access memory, in which a fast and low-power set process may be achieved in batches by only changing a forming pulse voltage to a set pulse voltage.

In the operating circuit and the operating method of the resistive random-access memory provided by the present disclosure, by connecting one capacitance on a bottom electrode terminal of each resistive random-access memory, the resistive random-access memory is grounded through the capacitance, so as to achieve the quick, low-power consumption forming or set process of the resistive random-access memory array in batches, the forming or set process of the resistive random-access memory array may be accelerated, the power consumption during the forming or set process of the resistive random-access memory array may be reduced, and the performance of the resistive random-access memory device after the forming or set process may be improved.

The specific embodiments described above further describe the purposes, technical solutions and beneficial effects of the present disclosure in detail. It should be understood that the above descriptions are only specific embodiments of the present disclosure, and are not intended to limit the present disclosure. Any modification, equivalent replacement, improvement, etc. made within the spirit and principle of the present disclosure should be included in the protection scope of the present disclosure.

What is claimed is:

1. An operating method of a resistive random-access memory, wherein the method comprises:
    connecting at least one capacitance in series with a resistive random-access memory, so that the resistive random-access memory is grounded through the at least one capacitance;
    applying a forming pulse voltage or a set pulse voltage on the resistive random-access memory to achieve a forming operation or a set operation of the resistive random-access memory,
    wherein the resistive random-access memory comprises an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction;
    wherein the connecting at least one capacitance in series with a resistive random-access memory comprises connecting one capacitance on each word line, so that bottom electrode terminals of the plurality of resistive random-access memory cells connected to the same word line are grounded through the one capacitance; and
    wherein the forming pulse voltages or the set pulse voltages are applied to the bit lines connected to the top electrode terminals of the plurality of resistive random-access memory cells,
    wherein the resistive random-access memory comprises an m×n resistive random-access memory array structure, each of m and n is a natural number greater than or equal to 1, top electrode terminals of a plurality of resistive random-access memory cells are connected to the same bit line in a column direction, and bottom electrode terminals of the plurality of resistive random-access memory cells are connected to the same word line in a row direction, line resistances of the word line between any two adjacent resistive random-access memory cells are $R_{wire}$ and line capacitances of the word line between any two adjacent resistive random-access memory cells are $C_{wire}$, each of the line capacitances is connected in parallel, and an influence of the line capacitances is considered to be grounded through one capacitance of $n \times C_{wire}$ on the word line;
    wherein the connecting at least one capacitance in series with a resistive random-access memory comprises using the line capacitances connected in parallel as grounded capacitances;
    wherein the forming pulse voltages or the set pulse voltages are applied to the bit lines connected to the top electrode terminals of the plurality of resistive random-access memory cells,
    wherein the forming pulse voltages are applied to the bit lines connected to the top electrode terminals of the plurality of resistive random-access memory cells comprises:
    selecting a first row bit line $BL_1$ through a bit line terminal MUX, floating a word line terminal MUX, so that the word lines $WL_1, WL_2, \ldots, WL_m$ for each column are grounded through the capacitances; applying a forming pulse voltage with a certain duration to the first row bit line $BL_1$, so as to complete a forming process of m resistive random-access memory cells connected to the first row bit line $BL_1$;
    turning on and grounding the word line terminal MUX, and resetting voltages on the capacitances to 0 after the forming process of the m resistive random-access memory cells connected to the first row bit line $BL_1$ is completed; after that, turning off the word line terminal MUX, and selecting a second row bit line $BL_2$ through the bit line terminal MUX, applying a forming pulse voltage with a certain duration to the second row bit line $BL_2$, so as to complete a forming process of m resistive random-access memory cells connected to the second row bit line $BL_2$;
    repeating the above process until a forming process of m resistive random-access memory cells connected to a nu row bit line $BL_n$ is completed, so that a forming process of the entire resistive random-access memory array is completed.

2. The method according to claim 1, wherein the resistive random-access memory comprises a resistive random-access memory cell, the capacitance is connected in series with a bottom electrode terminal of the resistive random-access memory cell, and the forming pulse voltage or the set pulse voltage is applied to a top electrode terminal of the resistive random-access memory.

3. The method according to claim 2, wherein the memory cell comprises a 1R structure having one resistive random-access memory cell.

4. The method according to claim 1, wherein the set pulse voltages are applied to the bit lines connected to the top electrode terminals of the plurality of resistive random-access memory cells specifically comprises:
    selecting a first row bit line $BL_1$ through a bit line terminal MUX, floating a word line terminal MUX, so that the word lines $WL_1, WL_2, \ldots, WL_m$ for each column are grounded through the capacitances; applying a set pulse voltage with a certain duration to the first row bit line $BL_1$, so as to complete a set process of m resistive random-access memory cells connected to the first row bit line $BL_1$;
    turning on and grounding the word line terminal MUX, and resetting voltages on the capacitances to 0 after the set process of the m resistive random-access memory cells connected to the first row bit line $BL_1$ is completed; after that, turning off the word line terminal MUX, and selecting a second row bit line $BL_2$ through the bit line terminal MUX, applying a set pulse voltage with a certain duration to the second row bit line $BL_2$, so as to complete a set process of m resistive random-access memory cells connected to the second row bit line $BL_2$;
    repeating the above process until a set process of m resistive random-access memory cells connected to a nu row bit line $BL_n$ is completed, so that a set process of the entire resistive random-access memory array is completed.

* * * * *